United States Patent [19]

Yamamoto et al.

[11] Patent Number: 4,956,748
[45] Date of Patent: Sep. 11, 1990

[54] WIRING APPARATUS FOR AUTOMOBILE

[75] Inventors: Masaki Yamamoto; Hideharu Hayashi; Yukio Muramatsu, all of Kosai, Japan

[73] Assignee: Yazaki Corporation, Tokyo, Japan

[21] Appl. No.: 477,154

[22] Filed: Feb. 9, 1990

Related U.S. Application Data

[63] Continuation of Ser. No. 308,217, Feb. 9, 1989, abandoned.

[30] Foreign Application Priority Data

Feb. 10, 1988 [JP] Japan .................................. 63-15687

[51] Int. Cl.$^5$ .......................................... H01R 13/514
[52] U.S. Cl. ........................................ 361/394; 439/34; 439/540; 439/638
[58] Field of Search ............... 361/393, 394, 426, 428; 439/34, 76, 540, 571, 638, 715, 716

[56] References Cited

U.S. PATENT DOCUMENTS

| | | | |
|---|---|---|---|
| 4,215,236 | 7/1980 | Reiser | 439/540 |
| 4,627,759 | 12/1986 | Kato | 439/364 |
| 4,684,198 | 8/1987 | Becraft et al. | 439/571 |
| 4,747,791 | 5/1988 | Nishio | 439/638 |

FOREIGN PATENT DOCUMENTS 55-47931 4/1980 Japan .

OTHER PUBLICATIONS

Western Electric Technical Digest, No. 63, Jul. 1981, "Surface Mounted Connecting Block", by Dix, p. 15.
IBM Technical Disclosure Bulletin, vol. 31, No. 5, Oct. 1988, "Support Structure", p. 359.

Primary Examiner—Gary F. Paumen
Attorney, Agent, or Firm—Armstrong, Nikaido, Marmelstein, Kubovcik & Murray

[57] ABSTRACT

A wiring apparatus for automobiles includes option-circuit blocks having optional circuits which are specific to certain models and classes of automobiles. The option-circuit blocks have a first group of connectors adapted for mating with a second group of connectors on a basic block which also includes a third group of connectors. The basic-circuit block and the option-circuit blocks are accommodated in a housing in which terminal connectors are placed to be matingly connected with the third group of connectors. The basic-circuit block is secured to the housing and both mechanical and electrical connections between the option-circuit block and the basic-circuit block are simultaneously established as the basic-circuit block is secured to the housing.

1 Claim, 4 Drawing Sheets

WIRING APPARATUS FOR AUTOMOBILE

This application is a continuation of application Ser. No. 308,217 filed Feb. 9, 1989, now abandoned.

BACKGROUND OF THE INVENTION

1. Field of the invention

The present invention relates to a wiring apparatus for use in wiring automotive electrical circuits which apparatus has an improved connection-mechanism between a basic-circuit block having basic circuits common to all types of models and classes of the automobiles and option-circuit blocks having optional circuits specific to individual models and classes of the automobiles.

2. Prior Art

A connection block has been commonly used for eliminating many multi-branch wirings existing in a wire harness to simplify wiring. Such a connection block generally incorporates many relays, fuses, and branch circuits consisting of a plurality of bus bars in a housing, and is connected through connectors to the wire harness from various loads and a variety of electrical components in the automobile.

Complexity of circuits within the connection blocks, however, depends on models, classes, and manufacturers of the vehicles, and may be expected to be changed when mounting additional electrical components to the vehicles later on. Thus a problem arises in wiring the automobile electrical circuits to provide and administer a wide variety of connection blocks.

In order to overcome this problem, the Applicant has proposed in Japanese Patent KOKAI publications No. 55-47931 a wiring method wherein the wiring apparatus consists of a basic block having basic circuits that can be incorporated in all types of cars regardless of their models and classes etc., and a block on which optional circuits can be selectively constructed in accordance with the models and classes of the vehicles thus providing general applicability by suitably combining these two blocks.

That is, in FIG. 4, an connection block a having basic circuits and a connection block b having optional circuits are connected to each other through a dovetail joint i.e., a groove and a plug inserted thereinto. Both blocks are provided with a plurality of fuses f and relays r. Many connectors C1, C2, C3 . . . are provided on the connection block a and wire harness WO, Wo'. . . are provided on the connection block b. Electrical connection between the connection block a and the connection block b is made by, for example, fitting the connector C1', on which the harness WO' is assembled, into the aforementioned connector C1.

The prior art wiring method having the connection block a inserted into the connection block b suffers from a drawback in that a two-step fitting procedure is required, one for fitting the two blocks through a dovetail joint and the other for fitting the connector C1' into C1. In this method the wire harness must have a sufficient play in its length for connector-fitting and connecting the two blocks in side by side relation through a dovetail joint requires a wide mounting space.

SUMMARY OF THE INVENTION

An object of the present invention is to provide a wiring apparatus for automobiles which not only permits simultaneous connection both mechanically and electrically between a basic-circuit block and a option-circuit block but also can be mounted in a narrow space.

BRIEF DESCRIPTION OF THE DRAWINGS

Further features and details of the present invention will be apparent from the following description of specific embodiments which are given by way of example with reference to the accompanying drawings, in which.

DETAILED DESCRIPTION OF THE PREFERRED EMBODIMENTS

Figure 1:
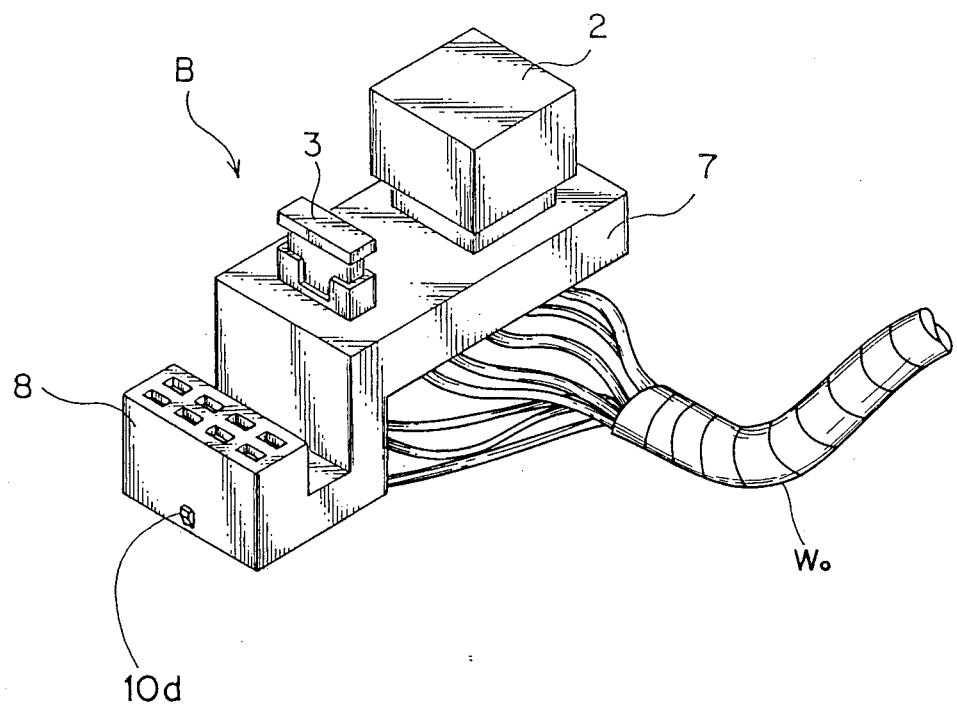
FIG. 1 is a perpective view of an option-circuit block having optional circuits according to the present invention.
Figure 2:
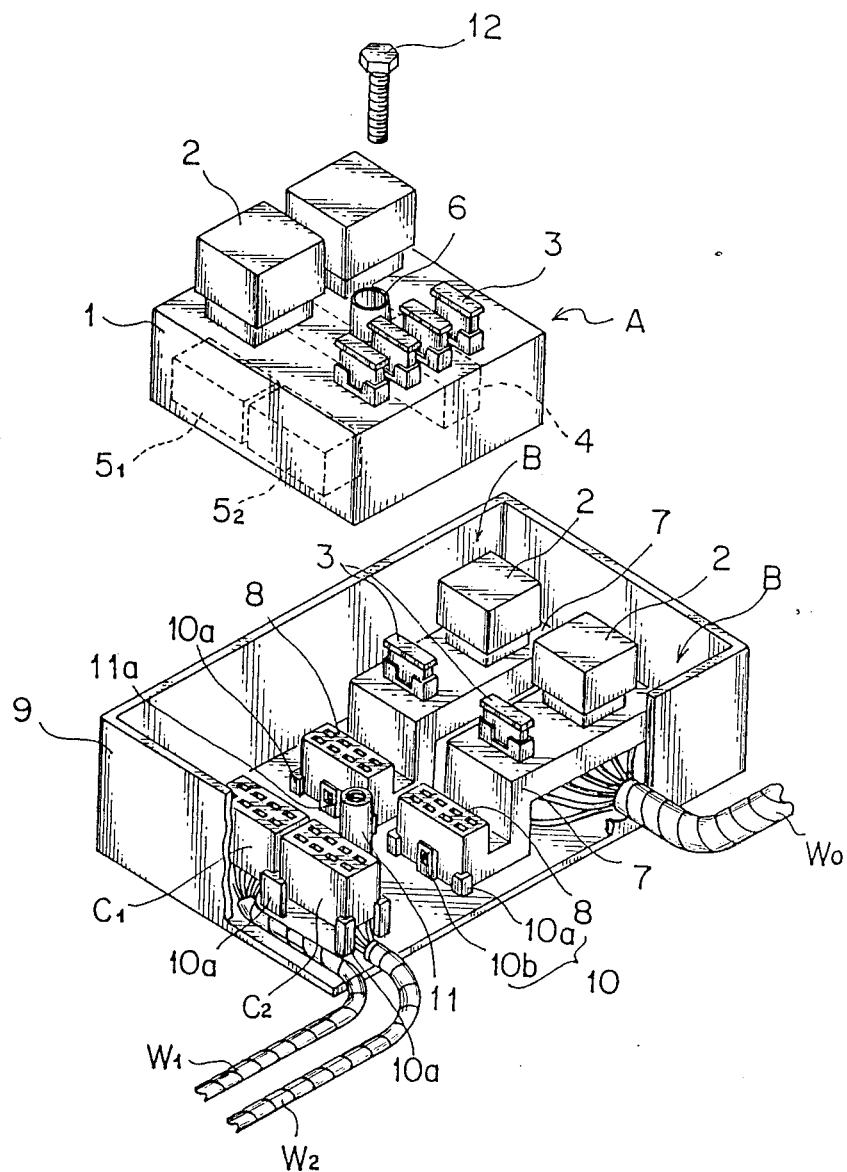
FIG. 2 is a perspective view of a wiring apparatus according to the invention.
Figure 3A:
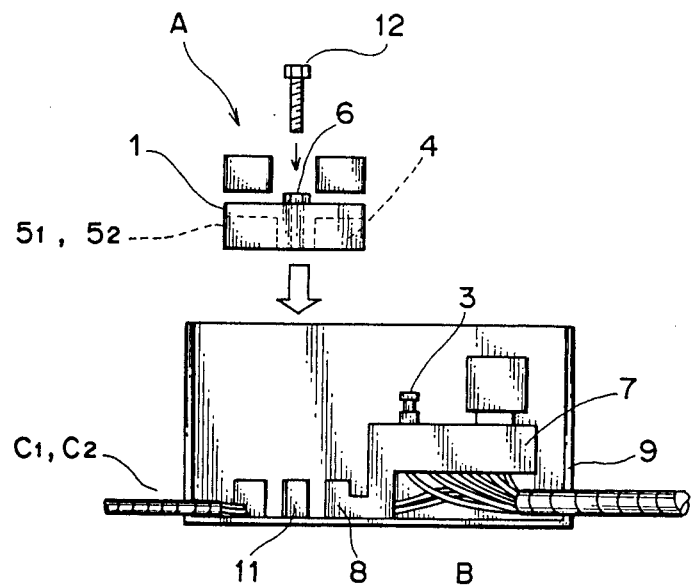
FIG. 3A and FIG. 3B are side views for showing a manner in which the apparatus according to the present invention is assembled.
Figure 3B:
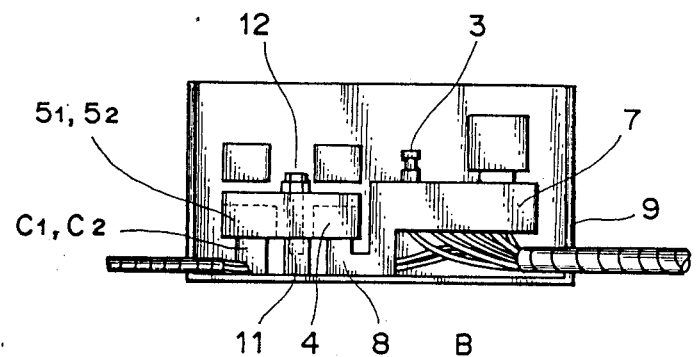

A wiring apparatus for automobiles according to the present invention will now be described with reference to FIG. 1 to FIGS. 3A-3B. In FIG. 2, a basic-circuit block A for constructing basic circuits, common to all types of cars, and of known construction formed mainly of bus bars and insulating boards is provided in a case 1. Likewise in FIG. 1, optional circuits specific to the individual models and classes etc. of the vehicles and consisting of, for example, bus bars are incoporated within an option-circuit block B. The block B is provided with a relay 2 and a fuse 3 that form an optional circuit thereon and is connected to a wire harness WO. The basic circuits common to the models and classes of the cars, include loads associated with an ignition system such as a starter motor, an ignition coil, and circuits to which lighting-lamp loads such as head lamps, tail lamps, left and right turn lamps are connected. The option circuits include loads such as fog lamps, an intermittent wiper, and power windows, and circuits to which various control units are connected.

On the upperside of the case 1 of the basic-circuit block A are mounted a plurality of relays 2 and fuses 3.

On the underside of the case 1 are provided connectors 4 to which connectors 8 on the option-circuit block B are matingly to be connected, thereby establishing electrical connection between circuits on the block A and the block or blocks B.

Also on the underside of the case 1 are provided harness connectors $5_1$, $5_2$, . . . to which terminal connectors C1, C2 . . . on the inner bottom of a housing (9) are to be matingly connected.

Wire harnesses W1, W2, . . . are connected with the circuits on the basic circuit block A through the terminal connectors C1, C2, . . . In addition, a bolt hole 6 is to provided to extend through the case 1.

The connectors 8 are integrally formed on a base 7 of the option-circuit block B and project upwardly to align with the connectors 4. Either the connectors 4 or the connectors 8 are formed as a female type connector having male type terminals of a known construction and the other is formed as a male type connector having female type terminals of a knwon construction. The terminals contact each other when the block A is fitted into the block B.

A clamping member 10, which projects upwardly, is provided on the bottom of the housing 9 on which an upper cover not shown is to be placed for protecting the components therein after assembly. The clamping member 10 consists of registry protrusions 10a and flexible clamping straps 10b for positioning the blocks B and connectors C1, C2, . . . accurately in place. The straps 10b engage protrusions 10d on the blocks B in snap-on relation. A bolt receiver 11 is also provided on the bottom of the housing 9 as a securing means having a female thread 11a longitudinally formed therewithin for securing the basic-circuit block A to the housing 9 by means of a bolt 12. The clamping straps 10b of the clamping member 10 may be omitted leaving only the registry protrusions 10a, particularly for small assemblies such as the terminals connectors C1, C2 . . . Alternate known locking devices may also be used instead of the above-mentioned bolt screwing-securement for mechanical connection between the basic-circuit block A and the housing 9.

During assembly, the option-circuit blocks B and the terminal connectors C1, C2, . . . are temporarily positioned on the bottom of the housing 9 by means of the registry protrusions 10a and clamping straps 10b. The option-circuit blocks and said terminal connectors are positioned so that the connectors 8 are aligned with the connectors 4 and the terminal connectors C1, C2, . . . are aligned with the connectors (5). Then the basic-circuit block A is applied on top of the block B and the terminal connectors C1, C2, . . . and is then secured to the housing 9 by screwing a bolt 12 through the bolt hole 6 into the female screw in the bolt receiver 11, thereby simultaneously fitting and connecting the connectors 4 and the connectors 8, as well as the harness connectors 5₁, 5₂. . . and the terminal connectors C1 and C2.

Therefore mechanical and electrical connection between the basic-circuit block A having the basic circuit and the option-circuit block or blocks B having the optional circuits can be completed simultaneously, thereby simplifying assembly procedure of the wiring apparatus.

The stacked assembly of the block A and the block B provides a space saving structure of the entire assembly.

Figure 4:
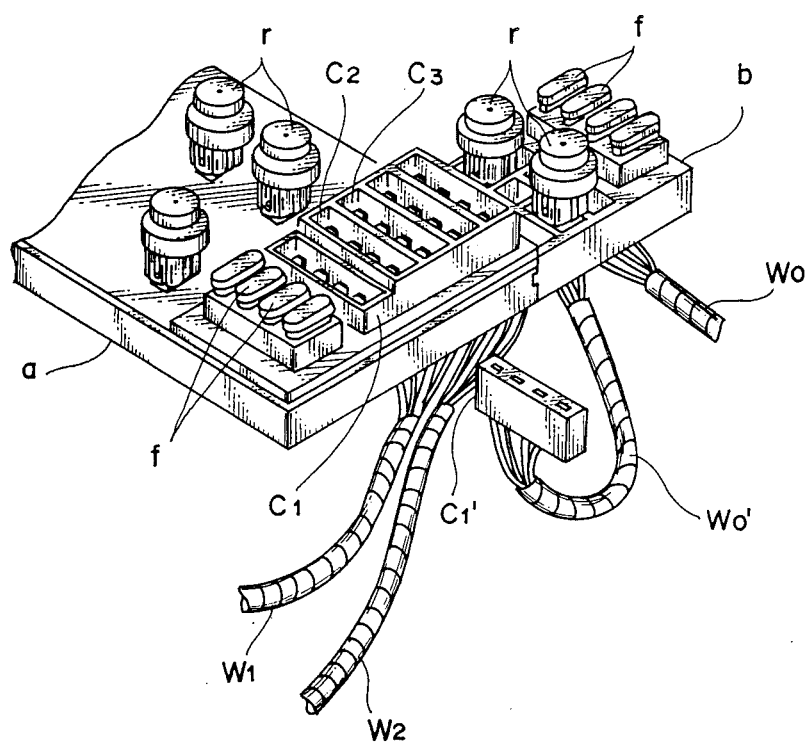
FIG. 4 is a perspective view showing a prior art wiring apparatus.

Additional wire harnesses, such as WO, WO' in the prior art apparatus shown in FIG. 4, can be eliminated, thereby requiring fewer parts, smaller mounting space and providing a neatly routed wire harness associated with the wiring apparatus.

What is claimed is:

1. A wiring apparatus for an automobile comprising:
    a housing (9) having a flat bottom, a projection (11) upwardly projecting from the bottom and being formed with a female thread therein, and a plurality of resilient clamping straps (10b), said projection and clamping straps being integrally formed with the bottom;
    at least one terminal connector (C) clamped to said bottom by means of said clamping straps, said terminal connector (C) having a wire harness connected to other electrical circuits in said automobile;
    at least one option-circuit block (B) having a first body clamped to the bottom by means of said clamping straps, said first body having on a topside thereof an optional circuit specific to models and classes of automobiles and on an underside thereof a space through which a wire harness extends to other electrical circuits in said automobile, said first body having a first connector (8) integrally formed therewith and remote from said option-circuit; and
    a basic-circuit block A having a second body, said second body having on a topside thereof a basic electrical circuit common to the models and classes of the automobiles, said second body having on an underside thereof at least one second connector (4) matingly connected to said first connector (8) and at least one third connector (5) matingly connected to said terminal connector (C), said second body having a hole therein, wherein
    said basic-circuit block A is mated with said option-circuit block B and said terminal connectors and then secured to said bottom by means of a bolt which passes through the hole and is threaded into said female thread, thereby simultaneously establishing both mechanical and electrical connection between said option-circuit block B and between said terminal connector (C).

* * * * *